United States Patent [19]
Shaw et al.

[11] Patent Number: 5,709,905
[45] Date of Patent: Jan. 20, 1998

[54] APPARATUS AND METHOD FOR AUTOMATIC MONITORING AND CONTROL OF STENCIL PRINTING

[75] Inventors: Michael F. Shaw, Sunrise; Anthony J. Suppelsa, Coral Springs; Dale R. Adams, Margate, all of Fla.

[73] Assignee: Motorola, Inc., Schaumburg, Ill.

[21] Appl. No.: 789,252

[22] Filed: Jan. 28, 1997

[51] Int. Cl.⁶ ............... B05D 1/32; B05C 11/02; B05C 3/20

[52] U.S. Cl. .................. 427/8; 427/96; 427/282; 118/669; 118/406; 118/413; 118/504; 101/129; 101/484

[58] Field of Search ............... 427/8, 282, 96; 118/406, 413, 504, 669; 101/129, 484; 364/468.26; 901/47; 222/163, 537

[56] References Cited

U.S. PATENT DOCUMENTS

| | | | |
|---|---|---|---|
| 4,119,480 | 10/1978 | Nishi et al. | 156/272 |
| 4,636,406 | 1/1987 | Leicht | 427/96 |
| 4,656,048 | 4/1987 | Kudoh et al. | 427/8 |
| 5,059,266 | 10/1991 | Yamane et al. | 156/64 |
| 5,110,615 | 5/1992 | Marorca et al. | 427/8 |
| 5,121,329 | 6/1992 | Crump | 364/468 |
| 5,260,009 | 11/1993 | Penn | 264/40.1 |
| 5,280,305 | 1/1994 | Monroe et al. | 346/107 R |
| 5,429,682 | 7/1995 | Harlow, Jr. et al. | 118/681 |
| 5,553,538 | 9/1996 | Freitag | 101/123 |
| 5,594,652 | 1/1997 | Penn et al. | 364/468.26 |

*Primary Examiner*—Shrive Beck
*Assistant Examiner*—Fred J. Parker
*Attorney, Agent, or Firm*—Glenn E. Gold

[57] ABSTRACT

A stencil printing apparatus (100) is provided for printing a solder paste (108), through apertures (104) in a stencil (102), onto metallized portions of a printed circuit substrate (106). The printing apparatus contains a laser surface profiling device (114) which is used to produce 2- and 3-dimensional profiles of a portion of the surface of solder paste adjacent to a squeegee (110). Data is processed and sent to a controller (118) which is coupled to a solder paste dispenser (112). The controller automatically signals the dispenser (112) to dispense additional solder paste at deficient locations as needed.

8 Claims, 3 Drawing Sheets

APPARATUS AND METHOD FOR AUTOMATIC MONITORING AND CONTROL OF STENCIL PRINTING

TECHNICAL FIELD

This invention relates in general to printed circuit board manufacturing and more particularly to a solder paste stencil printing apparatus having a laser profiling device.

BACKGROUND

Conventionally, the electronics industry has used screen or stencil printing for mass production soldering of electronic components to printed circuit boards (PCBs). This process involves aligning a metal plate having apertures, or a stencil, over a PCB such that the apertures are positioned where solder is desired on the PCB. Solder paste is placed on the stencil and transferred through the apertures, onto the underlying PCB, by the movement of a squeegee over the stencil. Leads on the electronic components are then placed in the solder paste deposits on the PCB. Next, the solder paste is reflowed and then cooled to form solid solder joints between the component and the PCB.

As integrated circuits (ICs) have become more complex, by packaging more functions in a smaller area, the number of IC package leads has increased while the distance between the leads, or pitch, has decreased. In addition, component density on PCBs has increased as manufacturers attempt to develop more compact products. This trend toward tighter pitch and higher component density has resulted in a corresponding reduction in the size and pitch (spacing) of the metallized areas on PCBs, requiring that solder paste be printed on the metallized areas with very high precision to avoid uneven paste deposits. The importance of printing consistent solder paste volume is critical; excessive paste may result in electrical shorts or bridging, while deficient paste volume may result in electrical opens or unreliable solder joints. These problems manifest themselves as defects in the product, resulting in quality problems costing time and money in rework and warranty repairs.

During the printing process, the volume of solder paste on the stencil is continually diminished as it is transferred, through stencil apertures, to the underlying PCB. Additional solder volume loss occurs due to migration of paste towards the edges of the stencil during printing. To avoid solder joint defects, it is critical that additional paste be periodically added to the stencil during the printing operation. However, it is difficult to accurately predict exactly when additional solder paste will be required. The number of print cycles possible before additional paste is needed will vary from stencil to stencil, due to the variable volumes being printed. In addition, the distribution of solder paste volume across a given stencil typically fluctuates. Therefore, although a sufficient volume of solder paste may be present on a given stencil, undesirable distribution may cause insufficient solder paste transfer at specific stencil aperture sites, resulting in uneven printing on the PCB. Thus, the number of print cycles between paste replenishment for an individual stencil will also vary. Furthermore, simply ensuring an abundance of solder paste on a stencil is not a desirable solution. Once solder paste is deposited on a stencil, physical properties of the exposed paste change with time. Solder paste left on a stencil for an extended period of time may negatively affect printing quality.

A common method for determining when to add solder paste to a stencil comprises random measurement of the height or volume of printed solder deposits on PCBs—with solder added to the stencil subsequent to the detection of insufficient deposits. This approach is inefficient since it results either in waste (i.e., scrapped boards) or paste printing rework. Other methods involve quantifying the weight or volume of paste on a stencil prior to printing. Again, regardless of paste volume, uneven distribution of paste across the stencil may result in deficient transfer of paste at specific aperture locations.

For the foregoing reasons, it would be beneficial to have an apparatus and corresponding process capable of automatically determining the need for additional solder paste prior to a printing operation. Furthermore, the apparatus should signal an operator that additional paste is required or, alternatively, the apparatus should automatically dispense additional paste on an as-needed basis.

DETAILED DESCRIPTION OF THE PREFERRED EMBODIMENT

Figure 1:
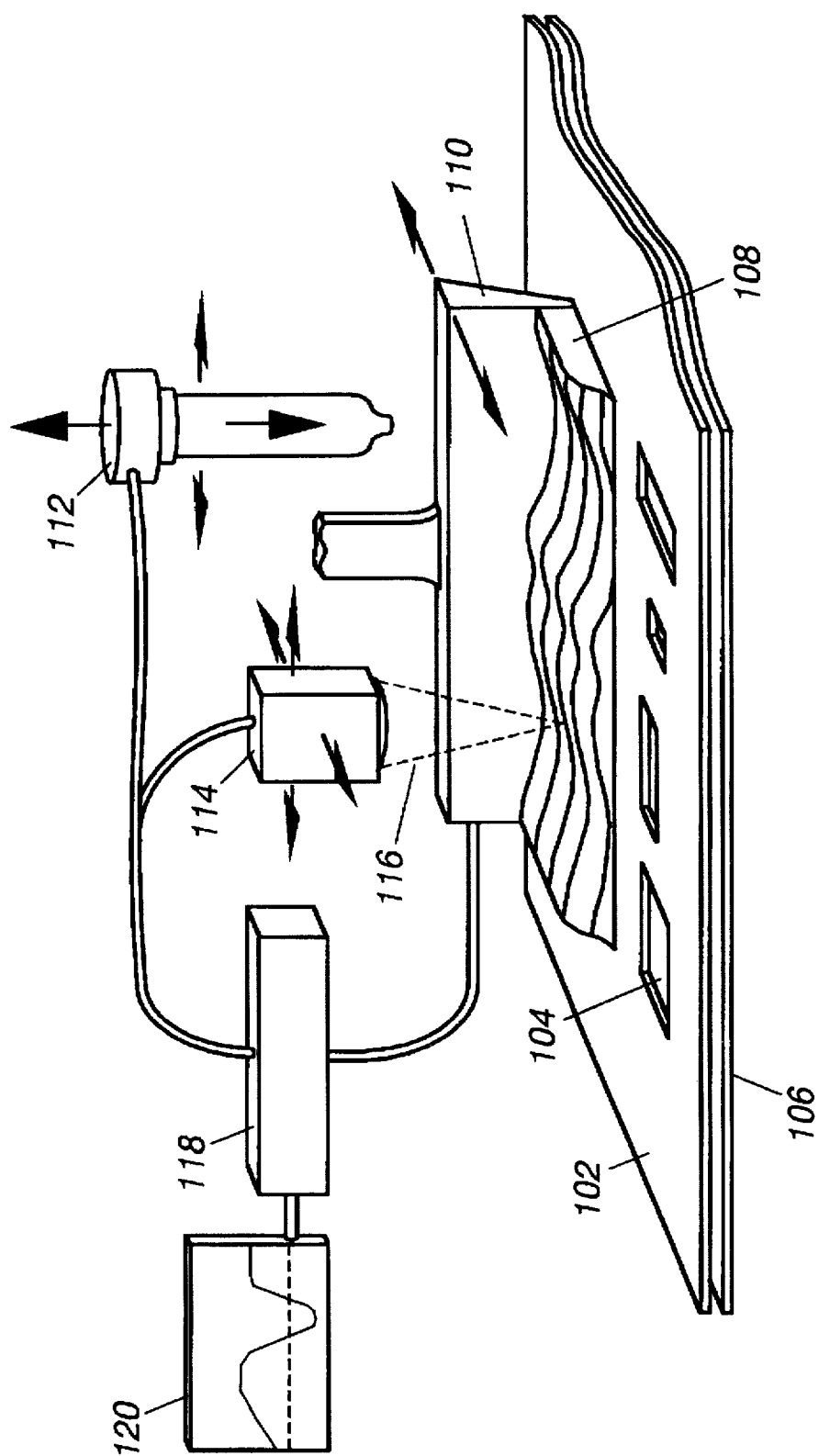
FIG. 1 is a perspective view of a stencil printing apparatus in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a stencil printing apparatus 100 is provided in accordance with the present invention. A viscous material 108, to be screen printed upon a receiving substrate 106, is provided upon a stencil 102. The viscous material is transferred, through apertures 104 in the stencil, to the receiving substrate by the movement of a squeegee 110 across the top of the stencil. Although the inventors envision printing solder paste on a printed circuit substrate, the invention is amenable to the screen printing of myriad viscous materials onto a variety of receiving substrates. For example, the invention could be incorporated into the screen printing of epoxy encapsulant and liquid solder resist materials, both commonly used in the electronics industry. Similarly, potential receiving substrates vary and are not limited to electronics industry applications, e.g., the invention could be implemented into the screen printing of ink onto cotton or polyester articles of clothing.

The stencil printing apparatus 100 has a laser surface profiling device 114 incorporated therein. Although there are a numerous methods available for mounting the profiling device, it is critical that device movement parallel to the plane of the stencil is possible. For example, the profiling device may be mounted via a linear motor axis, a lead screw mechanism or a mechanical sliding mechanism. The device emits a laser beam 116 which is reflected from the surface being profiled back to a sensor on the device. There are numerous sources of such laser profiling devices. For example, CyberOptics Inc., located in Minneapolis, Minn., manufactures a line of point range sensor (PRS) devices, having various resolutions, which would be applicable. The PRS is a non-contact, laser-based sensor which optically measures the distance from the sensor to an object, using a technique known as laser triangulation. A step distance is provided which defines the distance between consecutive optical measurements. Thus, a linear 2-dimensional profile is generated by providing a starting point, ending point, and step distance for each scan. Performing multiple linear scans, or rastering, produces a 3-dimensional topographic profile. In the preferred embodiment of the invention, profile data is communicated to a controller 118 which, depending upon the height or volume distribution of material 108 across the surface of the stencil 102, determines when, where and how much additional paste is needed. Some examples of controllers are personal computers, microprocessors and programmable logic controllers. Profile data may also be displayed at a display terminal or monitor 120.

Still referring to FIG. 1, a viscous material dispenser 112 is provided for dispensing viscous material 108 onto the stencil 102. In the preferred embodiment of the invention, a pneumatic dispensing unit, coupled to the controller 118, is used to provide additional solder paste to the stencil on an as-needed basis. The dispenser is attached to the solder printing apparatus such that motion both parallel to and normal to the plane of the stencil is possible, allowing the dispenser to be positioned at a specific paste-deficient site prior to dispensing. In an alternate embodiment of the invention, additional solder paste may be added manually by an operator of the apparatus. For instance, the operator could be signaled by an attached monitor 120 when additional paste is needed. Additional information could be provided on the monitor to assist the operator in determining the exact location of solder paste deficient site(s).

Figure 2:
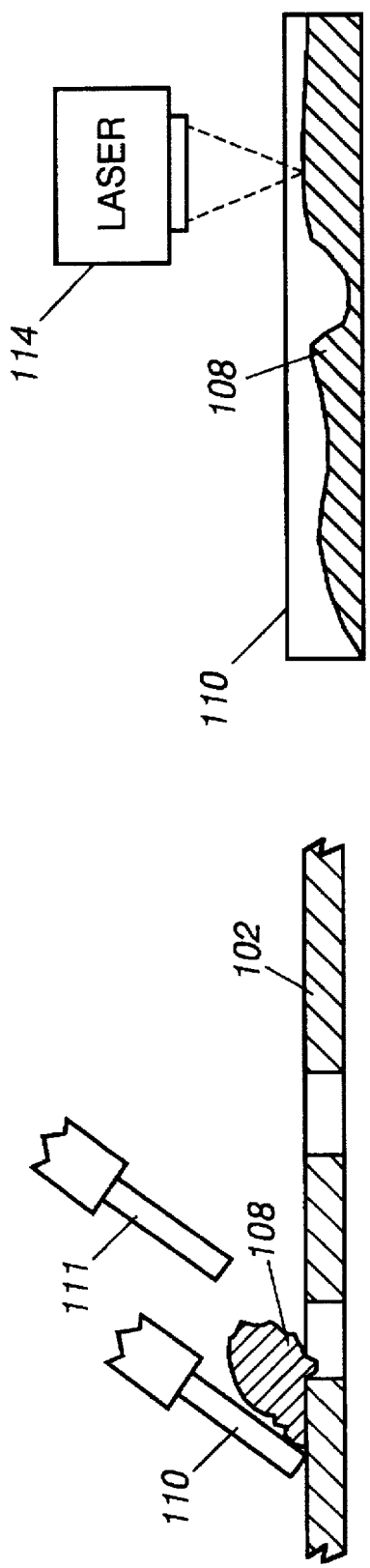
FIG. 2 is a cross-sectional view illustrating a stencil printer having two squeegees.

FIG. 2 illustrates a typical dual squeegee stencil printing apparatus wherein the material being printed is successively moved, back and forth, across the surface of a stencil 102 by a pair of squeegees 110,111; one squeegee pushes the material across the stencil in one direction and a second squeegee moves the solder paste back in the other direction. This method of screen printing is very common and is well known to those skilled in the art. Although the invention is not so limited, the inventors envision using such a dual squeegee stencil printer. In the preferred embodiment of the instant invention, surface profiling is performed, with the squeegees at rest, at predetermined printing intervals. Alternatively, profiling may be performed at nonuniform intervals at the discretion of the operator.

Figure 3:
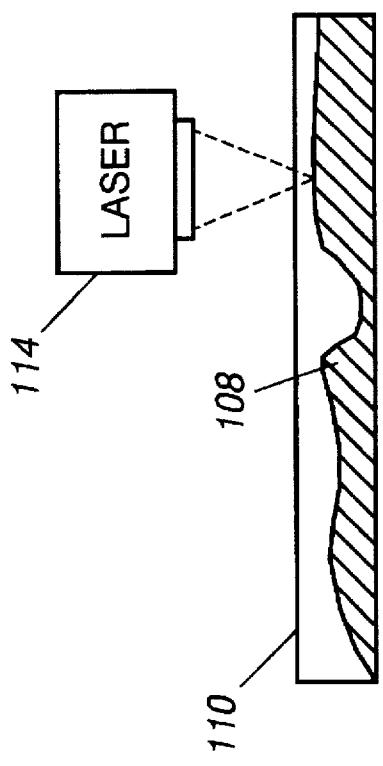
FIGS. 3–6 are a series of front views cross-sectioned through the material to be screen printed, illustrating a method of monitoring and controlling stencil printing in accordance with the present invention.

Referring now to FIGS. 3–6, consecutive steps illustrating the preferred process for controlling the addition of solder paste to a stencil are provided. The figures depict a front view (in the direction of squeegee movement) cross-sectioned through a mass of solder paste 108 adjacent to the squeegee 110. As depicted in FIG. 3, a laser surface profiling device 114 scans a portion of the surface of the solder paste. The portion of the solder paste surface which is profiled may change from application to application. In some instances, a linear (2-dimensional) profile may suffice; in other instances, a portion of the surface may be rastered to produce a 3-dimensional topographic profile.

Figure 4:
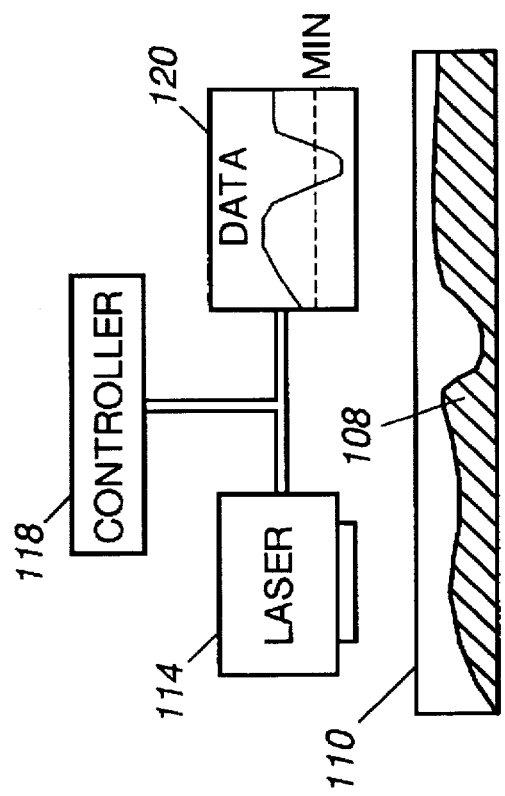

As further depicted in FIG. 4, optical measurement data is communicated to a controller 118. Here, current profile data is compared with predetermined boundaries. For example, current height data may be evaluated vis-a-vis predetermined minimum (or maximum) solder paste height criteria. Similarly, boundaries may be based upon solder paste volume measurements. In either case, the sufficiency of solder paste at each measured location is determined by comparison to such pre-set boundary values. If no deficient locations are found, stencil printing may be resumed.

Figure 5:
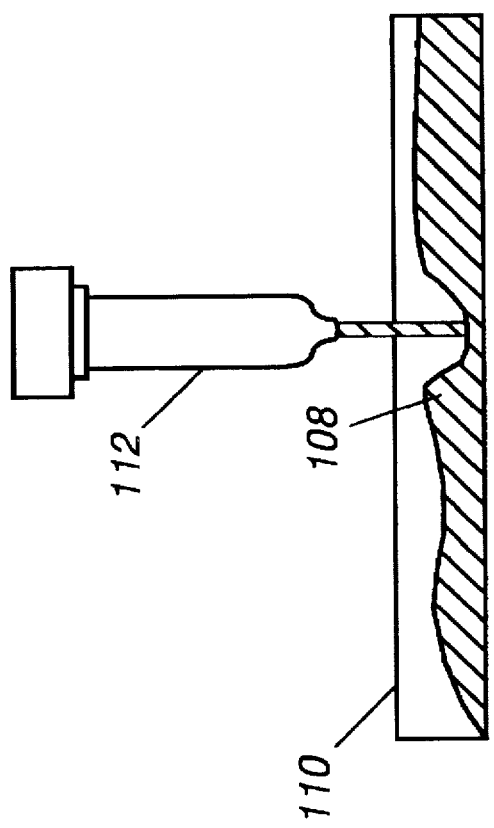
Figure 6:
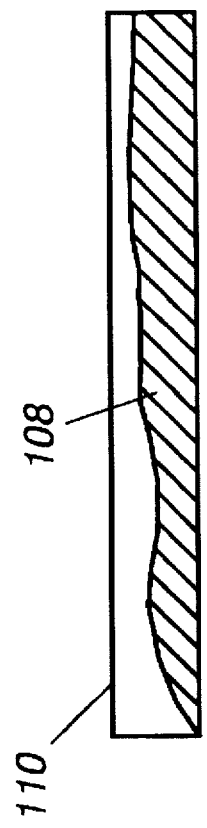

Referring now to FIG. 5, if the height or volume data at least one measured location is deemed insufficient, dispensing information is communicated to a solder paste dispenser 112 coupled to the controller 118. In the case of a pneumatic dispenser, solder paste will generally be dispensed from a syringe. The information relayed to the solder paste dispenser must include the coordinates (or location) of the paste-deficient regions. Additional information based upon the volume of additional solder paste desired at deficient regions may include dispensing parameters, such as: type of dispense (point or line); dispense pressure; and dispense time. To illustrate, suppose the results of a raster suggest a need for 1 additional cubic centimeter (cc) of solder paste at location x,y,z. Information relayed from the controller will move the dispenser to the proper location, where paste will be dispensed by applying pressure (p) to the paste for a given time (t) sufficient to dispense approximately 1 cc of paste. In contrast, if the solder paste is required to be added uniformly between two points (i.e., not at a single location), the dispenser will have to travel between the points while dispensing, requiring additional information regarding the dispense speed (s), i.e., the speed at which the dispenser travels between the points. Clearly, paste replenishment may require combinations of point and line dispensing. Once paste replenishment is completed (FIG. 6), stencil printing may be resumed.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A stencil printing apparatus for printing a viscous material onto a receiving substrate through apertures in a first surface of a stencil using a squeegee, while a second surface of the stencil parallel to the first surface is in contact with a receiving surface of the substrate, comprising:

a laser surface profiling device attached to said stencil printing apparatus such that a laser beam emitted from said laser surface profiling device is directed toward a portion of the viscous material disposed upon said first surface of the stencil, said laser profiling device movable parallel to said first surface of the stencil; and a controller coupled to said laser surface profiling device, said controller for receiving and interpreting topographical data communicated from said laser surface profiling device for said portion of said viscous material, and said controller providing feedback to a viscous material dispenser coupled to said controller in response to said topographical data.

2. The stencil printing apparatus of claim 1, in which said viscous material dispenser provides means for adding viscous material to said first surface of the stencil, and said viscous material dispenser adding viscous material to said first surface of the stencil in response to information from said controller.

3. The stencil printing apparatus of claim 1, wherein said viscous material dispenser comprises a pneumatic dispenser.

4. A stencil printing apparatus for printing a solder paste onto metallized portions of a printed circuit substrate through apertures on a first surface of a stencil using a squeegee, while a second surface of the stencil parallel to the first surface is in contact with a receiving surface of the substrate, comprising:

a laser surface profiling device attached to said stencil printing apparatus such that a laser beam emitted from said laser surface profiling device is directed toward a portion of the solder paste disposed upon said first surface of the stencil, said laser profiling device movable parallel to said first surface of the stencil;

a solder paste dispenser movable both parallel to, and normal to, the first surface of the stencil, said solder paste dispenser for adding solder paste to the first surface of the stencil; and a controller coupled to both said laser surface profiling device and said solder paste dispenser for receiving and interpreting topographical data communicated from said laser surface profiling device from said portion of the solder paste disposed upon said first surface of the stencil, and said controller providing feedback to said solder paste dispenser in response to said topographical data.

5. The stencil printing apparatus of claim 4, wherein said solder paste dispenser comprises a pneumatic dispenser.

6. A method of printing a viscous material onto a receiving substrate wherein the receiving substrate is loaded onto a printing apparatus, a stencil having apertures therethrough is aligned to the substrate, a volume of viscous material is dispensed on a first surface of the stencil while a second surface of the stencil parallel to the first surface is in contact with a receiving surface of the substrate, and a squeegee is moved across the first surface of the stencil to transfer the viscous material through the apertures of the stencil onto the substrate, the method comprising the following consecutively-performed steps:

(a) rastering a surface portion of said viscous material on said first surface of the stencil adjacent to said squeegee with a laser profiling device;

(b) generating topographical data for the rastered surface portion of said viscous material;

(c) communicating the generated topographical data to a controller coupled to said laser profiling device; and (d) comparing the topographical data communicated to said controller with predefined height or volume viscous material boundaries, said step of comparing determining whether additional viscous material is to be added to said first surface of the stencil in order to subsequently evenly distribute the viscous material through the apertures of the stencil onto the substrate.

7. The method of claim 6, further comprising the step of dispensing additional viscous material upon said first surface of said stencil when the step of comparing determines a need for additional viscous material.

8. The method of claim 7, wherein the step of dispensing is performed with a pneumatic dispenser.

* * * * *